United States Patent
Kwon et al.

(10) Patent No.: US 7,078,800 B2
(45) Date of Patent: Jul. 18, 2006

(54) SEMICONDUCTOR PACKAGE

(75) Inventors: Heung-Kyu Kwon, Kyungki-do (KR); Se-Yong Oh, Seoul (KR); Min-Ha Kim, Chungcheongnam-do (KR); Tae-Je Cho, Chungcheongnam-do (KR)

(73) Assignee: Samsung Elelctronics Co., Ltd., Suwon-si (KR)

( * ) Notice: Subject to any disclaimer, the term of this patent is extended or adjusted under 35 U.S.C. 154(b) by 0 days.

(21) Appl. No.: 10/957,176

(22) Filed: Sep. 30, 2004

(65) Prior Publication Data

US 2005/0056928 A1 Mar. 17, 2005

Related U.S. Application Data

(62) Division of application No. 10/245,228, filed on Sep. 16, 2002, now Pat. No. 6,952,050.

(30) Foreign Application Priority Data

Oct. 5, 2001 (KR) ................. 2001-61437

(51) Int. Cl.
*H01L 23/12* (2006.01)

(52) U.S. Cl. .................................... 257/704

(58) Field of Classification Search ...... 257/678–786; 29/890.03, 557
See application file for complete search history.

(56) References Cited

U.S. PATENT DOCUMENTS

| 4,620,215 | A | * | 10/1986 | Lee ............................. 257/713 |
| 5,291,064 | A | | 3/1994 | Kurokawa |
| 5,621,615 | A | | 4/1997 | Dawson et al. |
| 6,091,603 | A | | 7/2000 | Daves et al. |
| 6,255,140 | B1 | | 7/2001 | Wang |
| 2002/0074649 | A1 | | 6/2002 | Chrysler et al. |

FOREIGN PATENT DOCUMENTS

| JP | 03-173152 | 7/2001 |
| WO | WO 01/31082 A1 | 5/2001 |

OTHER PUBLICATIONS

English language abstract of Japanese Publication No. 03-173152.

* cited by examiner

*Primary Examiner*—Leonardo Andujar
(74) *Attorney, Agent, or Firm*—Marger Johnson & McCollom, P.C.

(57) ABSTRACT

Semiconductor packages are provided to prevent a chip, such as a central processing unit (CPU) chip, from being degraded due to hot spot heat generated during the operation of the chip and absorbs thermomechanical stresses in interfaces between the chip, a thermal interface material (TIM) and a lid. The chip is electrically connected, e.g., flip-chip bonded, to a package substrate. The lid is thermally connected to and disposed over a back surface of the chip with the TIM interposed therebetween. A heat dissipation means adjacent the TIM is also located between the lid and the chip to prevent the hot spot effect.

7 Claims, 5 Drawing Sheets

SEMICONDUCTOR PACKAGE

This is a divisional of application Ser. No. 10/245,228 filed Sep. 16, 2002, now U.S. Pat. No. 6,952,050.

BACKGROUND OF THE INVENTION

1. Field of the Invention

The present invention relates to the field of semiconductor packages and, more particularly, to a semiconductor chip package.

2. Description of the Related Art

Wire bonding is used to make electrical connections between central processing unit (CPU) chips and semiconductor packages. Flip-chip technologies have been employed to package high-speed semiconductor devices. There are two types of semiconductor package structures formed using the flip-chip technologies; a lid type and a non-lid type. The lid type structure is typically used in chip packages that include a high-frequency CPU chip that generates a large quantity of heat. The non-lid type structure is generally used in chip packages that have a low-frequency CPU chip that generates a relatively small quantity of heat.

FIGS. 1 and 2 show a conventional semiconductor chip package 100 having a lid 40. Electrode bumps 24 of a CPU chip 20 are attached to the upper surface 12 of a substrate 10 using flip-chip technology. The CPU chip 20 is covered with a lid 40. A plurality of external connection pins 30, are electrically connected to the CPU chip 20, extend from the lower surface 14 of the substrate 10. An epoxy resin 52 fills an area between the CPU chip 20 and the substrate 10 to provide an under-fill adhesive.

The lid 40 is made of a material having a good heat emissive capacity. In order to maximize the heat emissive capacity through the lid 40, a thermal interface material (TIM) 56 is interposed between a bottom surface 42 of the lid 40 and a back surface of the CPU chip 20. A non-conductive adhesive 54, (e.g., a non-conductive thermosetting silicone adhesive) is used as a sealant for attaching the lid 40 to the upper surface 12 of the substrate 10. After applying the non-conductive adhesive 54 to the periphery of the substrate 10, the lid 40 is attached and the non-conductive adhesive 54 is cured (hardened). Thus, the space on which the CPU chip 20 is mounted is encapsulated.

The TIM can be a thermal grease type material, or a rigid type material (such as epoxy or solder). The thermal grease type has a thermal conductivity of 1 to 6 W/mk. Epoxy has a thermal conductivity of 10 to 25 W/mk and solder has a thermal conductivity of 25 to 80 W/mk.

In a conventional semiconductor package 100, the TIM 56 is interposed between the lid 40 and the CPU chip 20. In this arrangement, damage may occur depending on the type of TIM 56 used. In a CPU chip, a single chip type cache SRAM is recently employed to improve interface speed in the system. In this case, a localized area of thermal stresses, such as a hot spot, may occur. The term "Hot spot," as used herein, refers to a local area where excessive heat is generated. As device power increases, the hot spot increases in size and/or number. When power reaches a predetermined level, the hot spot effects are greater than the other thermal stress factors. Thus, such a hot spot can degrade the performance of the CPU chip 20. In order to prevent the CPU chip 20 from being degraded, heat generated from the hot spot should be dissipated uniformly over the CPU chip 20 and emitted away from the CPU. However, the conventional TIM 56 does not have enough heat dissipation capability sufficient to dissipate the heat to a level as required above.

The thermal grease type TIM absorbs the thermomechanical stresses between the lid 40 and the CPU chip 20, but has a poor heat emissive capacity. On the other hand, the rigid type TIM, such as solder, has a good heat emissive capacity, but is less capable of absorbing the thermomechanical stresses between the lid 40 and the CPU chip 20. As a result, cracks can occur in the TIM 56 itself or in the CPU chip 20. Thermomechanical stresses arise due to differences in the coefficients of thermal expansion (CTE) between the lid 40, the CPU chip 20 and TIM 56. These CTE differences are commonly referred to as a "CTE mismatch."

Accordingly, a need arises for a semiconductor package that has a good heat emissive capacity and has an improved structure for absorbing thermomechanical stress.

SUMMARY OF THE INVENTION

The present invention provides a semiconductor package that uniformly dissipates heat over a chip that generates a large quantity of heat.

The present invention also provides a semiconductor package that absorbs thermal and mechanical stresses generated in interfaces between a chip, a thermal interface material and a lid.

According to one embodiment of the present invention, a semiconductor package includes a heat dissipation means located between a lid and a chip to prevent the hot spot effect during the operation of the chip. The semiconductor package has the lid disposed over and thermally connected to the back surface of the chip. A thermal interface material (TIM) is also located between the lid and the chip. The TIM can be formed directly under the lid over the heat dissipation means. Alternatively, for example, the TIM can be directly under the heat dissipating means and above the chip.

The heat dissipation means has a thermal conductivity of 100 W/mk or more and has a coefficient of thermal expansion of 4.0 or less.

According to yet another embodiment of the present invention, the heat dissipation means may be formed of a heat dissipation cover formed around the outer surface of the chip except the active surface of the chip, or may be formed of a heat dissipation layer formed on the bottom surface of the lid opposite to the TIM.

A filling material may fill a space between the lid and the substrate for dissipating the thermal and mechanical stresses generated in the chip.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate the structural elements, and, in which.

DETAILED DESCRIPTION OF THE PREFERRED EMBODIMENTS

Preferred embodiments of the present invention will be described below with reference to the accompanying drawings.

Figure 1:
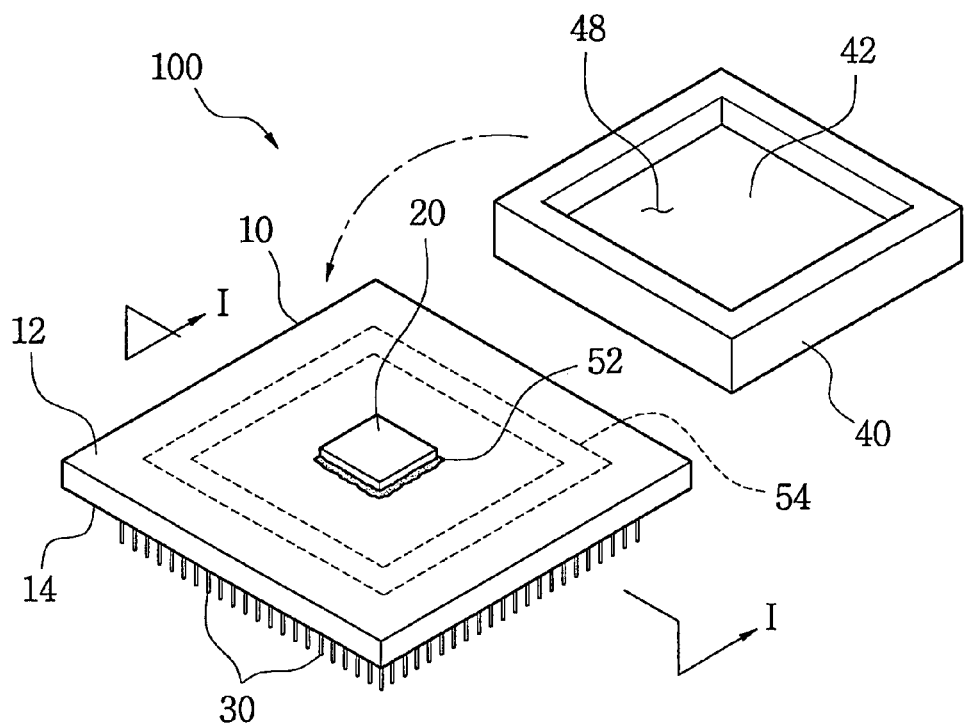
FIG. 1 is a perspective view of a conventional semiconductor package having a lid.
Figure 2:
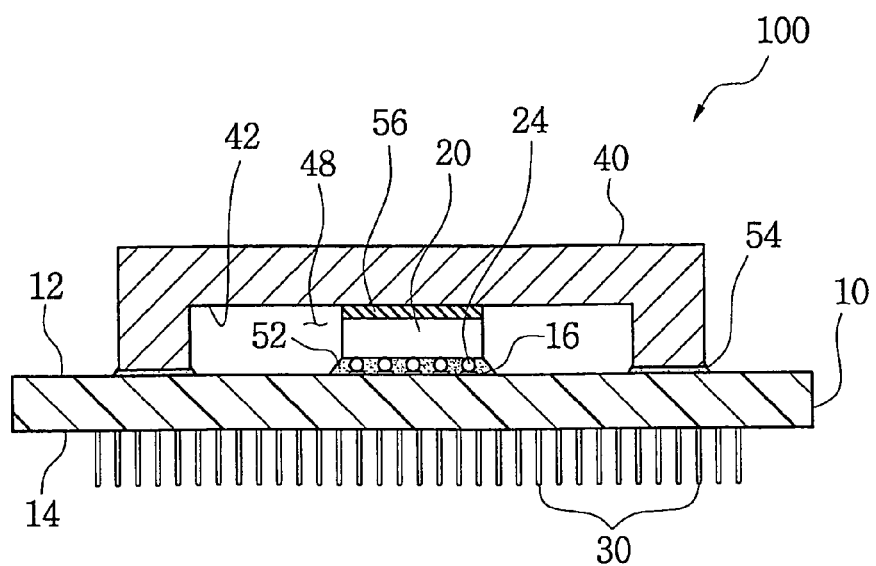
FIG. 2 is a cross-sectional view taken along the line I—I in FIG. 1.
Figure 3:
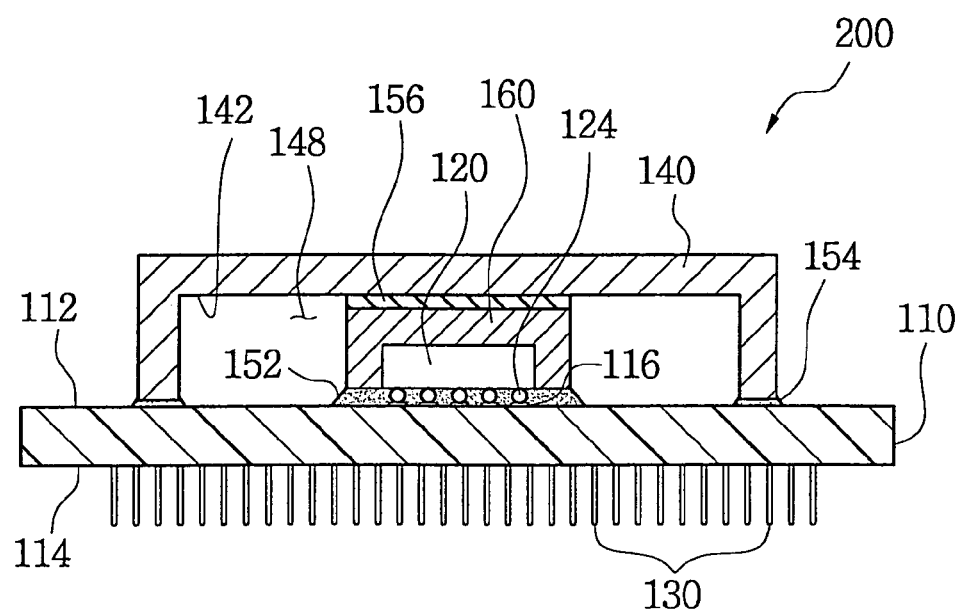
FIG. 3 is a cross-sectional view of a semiconductor package in accordance with a first embodiment of the present invention, showing a heat dissipation cover between a lid and a CPU chip.
Figure 4:
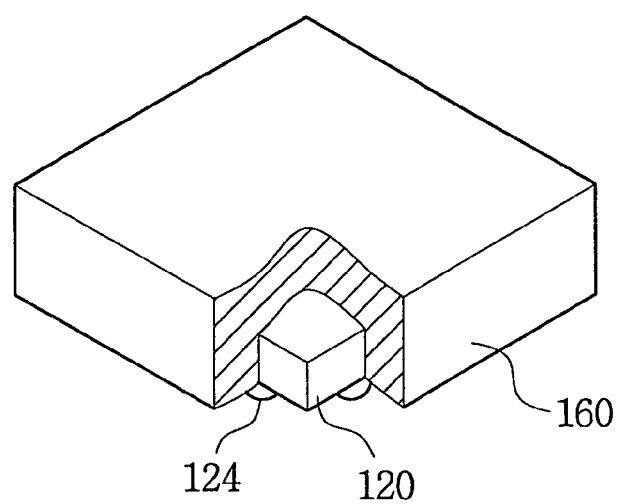
FIG. 4 is a partially cutaway perspective view of the heat dissipation cover in FIG. 3, in which the heat dissipation cover is formed along the periphery of the CPU chip.

FIG. 3 is a cross-sectional view of a semiconductor package 200 in accordance with an embodiment of the present invention, showing a heat dissipation cover 160 between a lid 140 and a CPU chip 120. FIG. 4 is a partially cutaway perspective view of the heat dissipation cover 160 shown in FIG. 3, in which the heat dissipation cover 160 is formed along the periphery of the CPU chip 120.

With reference to FIGS. 3 and 4, the CPU chip 120 is attached to an upper surface 112 of a substrate 110 using a flip chip bonding method or any other suitable methods and covered with a lid 140. A thermal interface material (TIM) 156 is located between the lid 140 and the CPU chip 120. A plurality of external connection pins 130, electrically connected to the CPU chip 120, extend from a lower surface 114 of the substrate 110. An epoxy region 152 fills an area between the CPU chip 120 and the substrate 10 to provide an under-fill adhesive.

According to an embodiment of the present invention, a semiconductor package 200 includes the CPU chip 120 covered with a heat dissipation cover 160 along the periphery of the CPU chip 120 except the active surface of the CPU chip 120. The heat dissipation cover 160 uniformly dissipates and carries away heat generated in a hot spot over the CPU chip 120, thereby preventing the CPU chip 120 from being degraded due to the hot spot. Preferably, the heat dissipation cover 160 has a thermal conductivity of 1,000 W/mk or more, and can be made of diamond, graphite or synthetic silicon, which has a coefficient of thermal expansion of 4.0 or less. The heat dissipation cover 160 may be formed by a sintering method, an injection molding method or a die casting method, for instance.

The CPU chip 120 is flip-chip bonded to the substrate 110. The CPU chip 120 having the heat dissipation cover 160 is mounted on a substrate pad 116 of the upper surface 112 of the substrate 110. Then, a reflow process is carried out, for example, at a temperature of 350 to 360° C. for approximately 100 seconds. The space between the CPU chip 120 and the substrate 110 is filled with a liquid epoxy resin 152 at a predetermined temperature using an under-filling method. The epoxy resin 152 is then hardened at a predetermined temperature.

The substrate 110 is a circuit wiring board having wiring patterns, and can be a printed circuit substrate, a ceramic substrate, a tape wiring substrate and so on. The substrate pad 116, which is electrically connected to electrode bumps 124 of the CPU chip 120, is formed on the upper surface 112 of the substrate 110. The substrate 110 includes wiring patterns (not shown) that connect the substrate pad 116 to external connection pins 130. On the lower surface 114 of the substrate 110 are external connection pins 130. The pin type external connection terminals may be replaced by ball type external connection terminals or any other connection terminals suitable for implementing the principles of the present invention.

The lid 140 is made of a conductive metal having a good heat emissive capacity, for example Cu, Al, CuW, AlSiC, AlN or BeO as a basic material, coated with a conductive material, for example Ni, Au, Ag, Sn or Cr on the surface thereof. The lid 140 has a chip mounting space 148 inside thereof in order to receive the CPU chip 120. The portion of the outer wall of the lid 148 is attached to the upper surface 112 of the substrate 110.

Contacts with the TIM 156 and the lid 140 may include a passivation layer comprising (Ti, Cr)/Ni/(Au, Ag) to prevent oxidation and contamination. The contacts may be formed by an anodizing process. In this application, multi-layered metal layers are described as "A(B)/(C)/D," where "/" represents a metal between the layers. A(B) means that the layer A is formed but B may be replaced with A. (C) means that C may be formed or may not be formed.

In order to maximize the heat emissive capacity through the lid 140, the TIM 156 is interposed between a bottom surface 142 of the lid 142 and a back surface of the CPU chip 120. The TIM 156 may be a thermal grease type or a rigid type that forms a coating using a dispensing method. If solder is used as a TIM, based on Pb, Sn, In, Ag, Bi, Sb or Au as a basic material, an under barrier metal (UBM) such as Ti (Cr)/VNi/Au (Ag) is preferably formed on the bottom surface 142 of the lid 140 and on the upper surface of the heat dissipation cover 160 for good bondability with the solder. On the other hand, in the case of a thermal grease type, such an UBM may not be needed.

The lid 140 is attached to the upper surface 112 of the substrate 110 with the non-conductive adhesive 154 so that the CPU chip 120 may be included in the chip mounting space 148. The non-conductive adhesive 154 is preferably a non-conductive thermosetting silicone adhesive. That is, the non-conductive adhesive 154 is applied to the area to which the lid 140 is to be attached. The lid 140 is attached and the adhesive is hardened. Thus, the CPU chip mounted area is hermetically sealed. The hardening process of the non-conductive adhesive 154 can be carried out at the temperature of 100 to 150° C. for approximately one hour, for instance.

According to one embodiment of the present invention, the heat dissipation cover 160 surrounds the periphery of the CPU chip 120, due to excellent thermal conductivity of the heat dissipation cover 160, dissipates heat from the hot spot, which is generated during the operation of the CPU chip 120. This prevents the defects that might result from the hot spot. Further, the heat dissipation cover 160 comprises a material having a low coefficient of thermal expansion, and capable of absorbing the thermomechanical stresses between the TIM 156 and the lid 140.

Although embodiments of the present invention preferably use the lid 140 having the chip mounting space 148, a lid having a plate shape without the chip mounting space 148 may be also used. The plate-shaped lid is arranged on a stiffener ring and the back surface of the CPU chip 120, after the stiffener ring or pedestal is placed along the periphery of the substrate 110.

Figure 5:
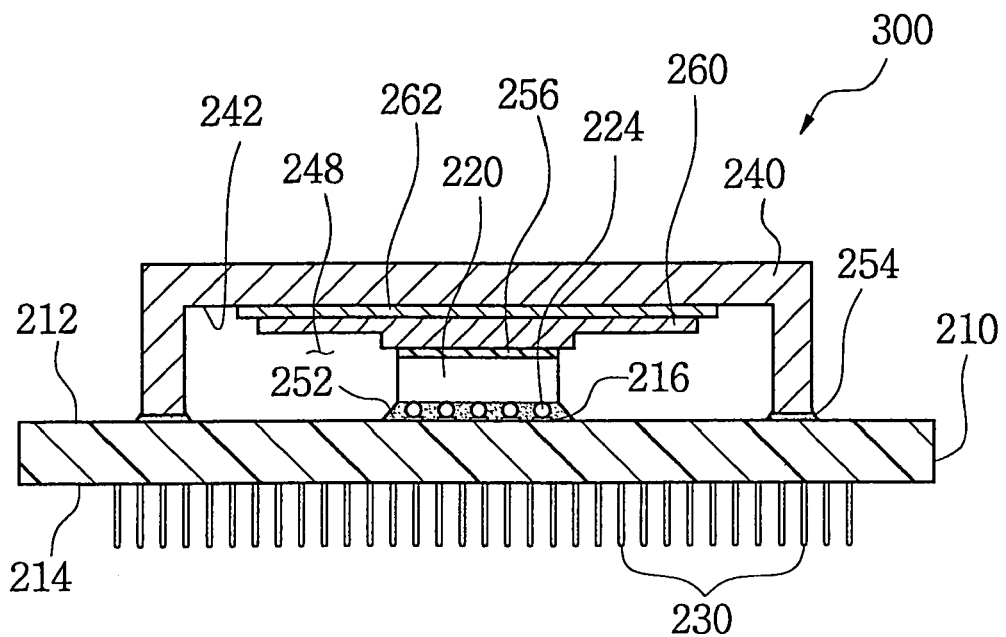
FIG. 5 is a cross-sectional view of a semiconductor package in accordance with a second embodiment of the present invention, showing a heat dissipation layer formed on an inner surface of the lid.
Figure 6:
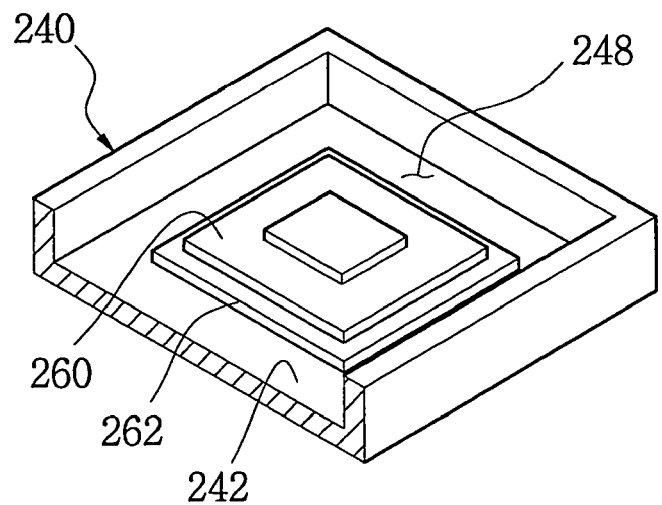
FIG. 6 is a partially cutaway perspective view of the heat dissipation layer in FIG. 5.

Although the above-described embodiment of the present invention discloses, as illustrated in FIGS. 3 and 4, the heat dissipation cover 160 formed around the outside surface of the CPU chip 120 except the active surface of the CPU chip 120 to prevent the hot spot effect, a heat dissipation layer 260 may also be formed on the bottom surface 242 of the lid 240, as shown in FIGS. 5 and 6.

Referring to FIGS. 5 and 6, a CPU chip 220 is electrically connected, for example, flip-chip bonded to an upper surface 212 of a substrate 210 and covered with the lid 240. A TIM 256 is formed between the lid 240 and a back surface of the CPU chip 220. A heat dissipation layer 260 is formed on a bottom surface 242 of the lid 240 and is in contact with the TIM 256.

According to another embodiment of the present invention, the heat dissipation layer 260 is substantially identical to the heat dissipation cover 160 of the above-described embodiment in that the heat from hot spot is dissipated and emitted away from the CPU chip 220, thereby preventing the CPU chip 220 from being degraded. Elements 214, 216, 224, 230, 248, 252, and 254 have generally the same structure and function as the corresponding elements having the same last two digits in semiconductor package 200. The heat dissipation layer 260 may be made of the same material as the heat dissipation cover 160. In order to form the heat dissipation layer 260 on the lid 240, an under barrier metal (UBM) 262 is preferably formed before the formation of the heat dissipation layer 260. The UBM 262 is preferably formed by, for example, an anodizing method, a plating method, a sputtering method or an evaporation method, depending on the material used to form the lid 240. For example, if the lid 240 is made of aluminum, the UBM 262 is preferably formed by an anodizing method. If the lid 240 is made of Cu, CuW, AlSiC or CuMo, the UBM 262 is preferably formed by a plating method. And, if the lid 240 is made of Si, $SiO_2$, $Al_2O_3$, AlN or BeO, the UBM 262 is preferably formed by a sputtering or an evaporation method. The UBM 262 in this embodiment may be identical to the UBM used in the conventional solder or gold bump, for example, Cr (Ti)/(V7Ni93)/Au(Ag, Pd), Cr/Ni/Cu/Ag(Au, Pd), or TiW/Vni/Au(Ag) or Ni/Au(Ag, Pd).

A portion of the lid 240 exposed through the heat dissipation layer 260 preferably has a passivation layer such as Ni/(Au, Ag) or (Ti, Cr)/Ni/(Au, Ag) formed thereon to prevent oxidation and contamination.

If solder, based on Pb, Sn, In, Ag, Bi, Sb or Au, is used as a TIM, an UBM such as Ti (Cr)/VNi/Au (Ag) is preferably formed between the heat dissipation layer 260 of the lid 240 and the back surface of the CPU chip 220 for good bondability.

Figure 7:
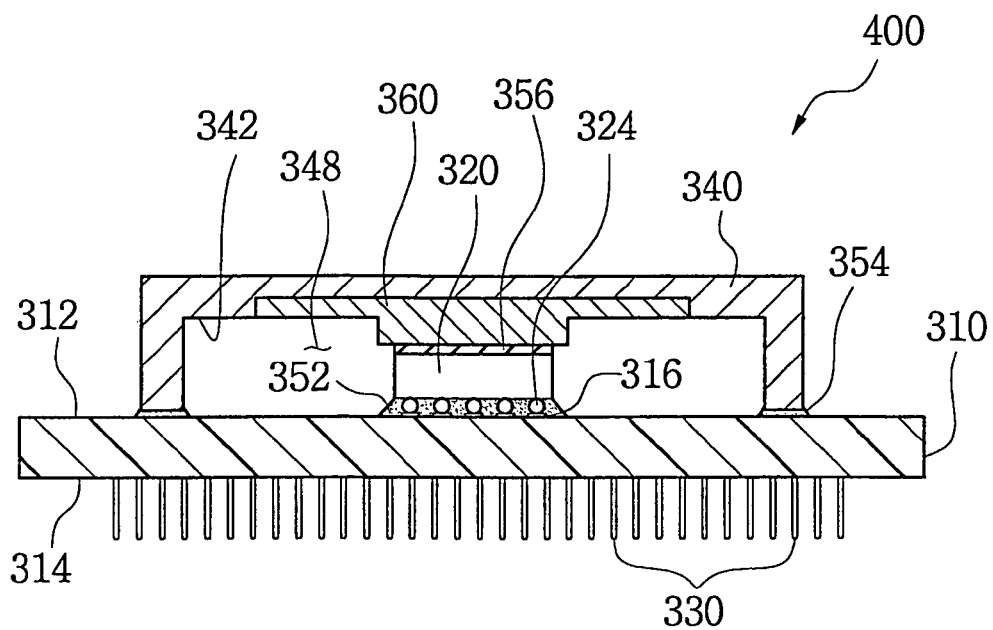
FIG. 7 is a cross-sectional view of a semiconductor package in accordance with a third embodiment of the present invention, showing the heat dissipation layer formed on an inner surface of the lid.
Figure 8:
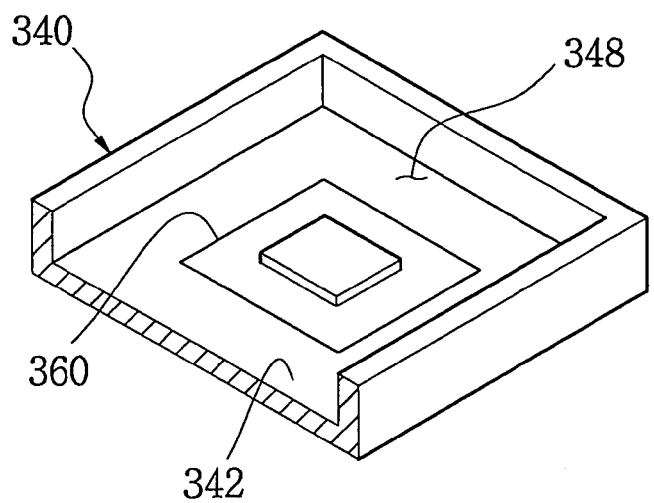
FIG. 8 is a partially cutaway perspective view of the heat dissipation layer in FIG. 7.

Although this embodiment of the present invention discloses the heat dissipation layer 260 formed on an existing lid 240, the heat dissipation layer 260 may be alternatively formed during the manufacture of the lid 240, as shown in FIGS. 7 and 8.

According to yet another embodiment of the present invention, a heat dissipation layer 360 is formed integral with a lid 340 during the formation of the lid 340 using a method such as a sintering method, an injection molding or a die casting method. Elements 314, 316, 324, 330, 348, 352, and 354 have generally the same structure and function as the corresponding elements having the same last two digits in semiconductor package 200. The structure of a semiconductor package 400 in this embodiment is substantially identical to the above-described embodiment. Thus, detailed description thereof is omitted.

Figure 9:
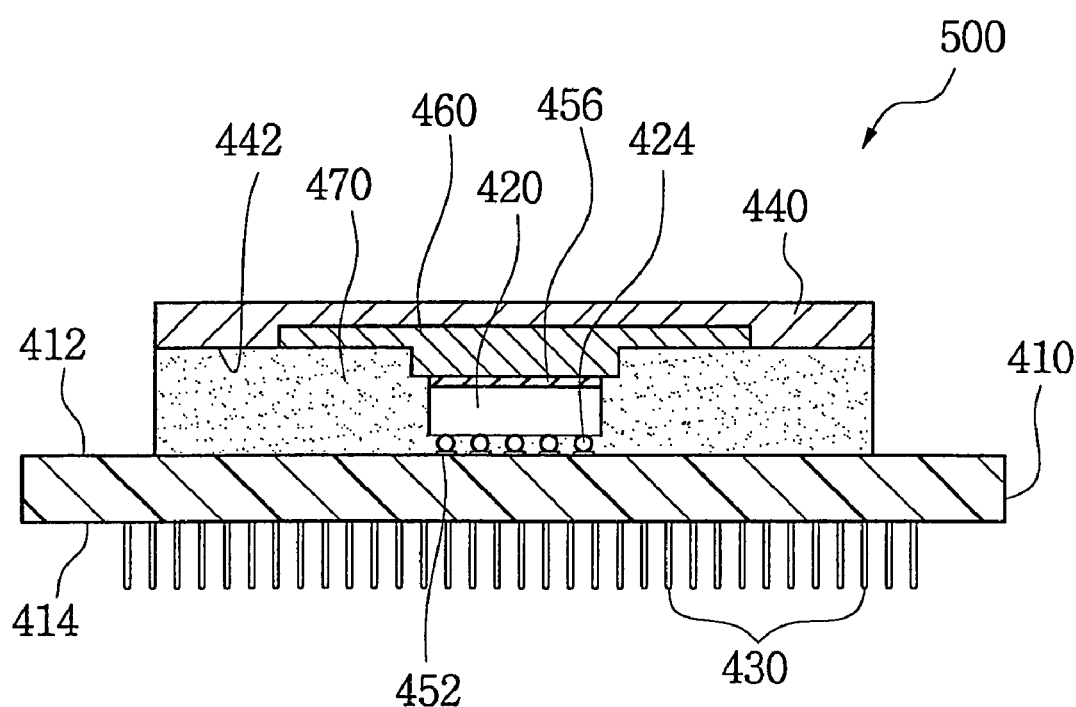
FIG. 9 is a cross-sectional view of a semiconductor package in accordance with a forth embodiment of the present invention, in which the heat dissipation layer is formed on an inner surface of the lid, showing filling material being filled a space between the lid and the substrate.

Although the present invention discloses a lid-type semiconductor package having the chip mounting space, a lid 440 having a plate-shape may be also used as shown in FIG. 9.

Referring to the FIG. 9, a CPU chip 420 is electrically connected, for example, flip-chip bonded to an upper surface 412 of a substrate 410 and covered with a lid 440. A thermal interface material (TIM) 456 is interposed between a lid 440 and the CPU chip 420. The lid 440 has a plate shape and is formed with a heat dissipation layer 460. The heat dissipation layer 460 is formed on the bottom surface 442 of the lid 440 and is in contact with the TIM 456. Elements 414, 416, 424, 430, 448, 452, and 454 have generally the same structure and function as the corresponding elements having the same last two digits in semiconductor package 200.

A space between the lid 440 and the substrate 420 is filled with a filling material 470. The filling material may be epoxy molding compound (EMC), underfill epoxy or silicon. The filling material dissipates the thermal and mechanical stresses applied on the CPU chip 420.

The space between the lid 440 and the substrate 410 may be directly filled with the filling material 470 without an under-filling process, the space between the lid 440 and the substrate 410 may be alternatively filled with the filling material after the under-filling process.

Although the preferred embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims. For example, the CPU chip having the heat dissipation cover may be attached to the substrate by a flip-chip bonding method or other suitable methods. The plate-shaped lid may be covered. Then, a filling material fills a space between the lid and the substrate. Further, the lid having the heat dissipation layer on the bottom surface of the plate-shaped lid may be used in the semiconductor package. In addition, although the above-described embodiments are described in connection with the CPU chip, a person skilled in the art will appreciate that the principles of the present invention can be applied in others types of semiconductor chips that generate a large quantity of heat.

What is claimed is:

1. A semiconductor package comprising:
   a chip having an active surface and an outside surface, the chip having a plurality of electrode bumps formed on the active surface thereof;
   a package substrate having an upper surface and a lower surface opposite the upper surface, the chip being electrically connected to the upper surface of the substrate;
   a lid thermally connected to and disposed over the upper surface of the chip for emitting heat generated from the chip;
   a thermal interface material (TIM) comprising solder formed on the upper surface of the chip for transferring heat generated from the chip to the lid;
   one of a heat dissipation layer and an under barrier metal (UBM) formed on the upper surface of the TIM and having a surface area that is at least double the outside surface area of the chip; and the other of the heat dissipation layer and UBM formed adjacent the lower surface of the lid.

2. The semiconductor package of claim 1, wherein the lid is made of aluminum and the UBM is formed by anodizing, followed by sputtering or evaporation.

3. The semiconductor package of claim 1, wherein the lid is made of Cu, CuW, AlSiC or CuMo and the UBM is formed by a plating method.

4. The semiconductor package of claim 1, further comprising external connection terminals extending from the lower surface of the substrate and electrically connected to the chip.

5. The semiconductor package of claim 1, wherein the chip is electrically connected to the substrate using a flip chip technology.

6. The semiconductor package of claim 1, wherein the heat dissipation layer has a thermal conductivity of about 1000 W/mk or more and comprises a material having a coefficient of thermal expansion of about 4.0 or less.

7. The semiconductor package of claim 1 wherein the TIM is between the chip and the heat dissipation layer.

* * * * *